United States Patent [19]

Spencer et al.

[11] Patent Number: 4,514,799
[45] Date of Patent: Apr. 30, 1985

[54] BUS SYSTEM ARCHITECTURE AND MICROPROCESSOR SYSTEM

[75] Inventors: William H. Spencer, Monrovia; Thomas E. Anderberg, Chatsworth, both of Calif.

[73] Assignee: Bell & Howell Company, Chicago, Ill.

[21] Appl. No.: 237,804

[22] Filed: Feb. 24, 1981

[51] Int. Cl.³ .......................... H05K 1/04; G06F 3/00
[52] U.S. Cl. .................................................. 364/200
[58] Field of Search ............... 364/200, 900; 361/391, 361/397, 399, 400, 407, 409, 412, 415, 420; 29/825, 829, 830, 837, 842; 174/212, 109, 138 G, 68.5

[56] References Cited

U.S. PATENT DOCUMENTS

| | | | |
|---|---|---|---|
| 3,437,740 | 4/1969 | Rosenberg et al. | 361/407 |
| 3,448,345 | 6/1969 | Koehler, Jr. et al. | 361/407 |
| 3,470,421 | 9/1969 | Shore et al. | 361/407 |
| 3,491,267 | 1/1970 | Goshorn | 361/407 |
| 3,560,799 | 2/1971 | Bochicchio | 361/407 |
| 3,562,592 | 2/1971 | Cooke et al. | 361/409 |
| 3,564,114 | 2/1971 | Blinder et al. | 361/409 |
| 3,644,661 | 2/1972 | Asar et al. | 361/407 |
| 3,675,083 | 7/1972 | White | 361/409 |
| 3,725,843 | 4/1973 | Johnson | 361/407 |
| 3,728,471 | 4/1973 | Blinkhorn | 361/409 |
| 4,060,849 | 11/1977 | Bienvenu et al. | 364/200 |
| 4,181,974 | 1/1980 | Lemay et al. | 364/200 |
| 4,200,930 | 4/1980 | Rawlings et al. | 364/200 |
| 4,204,249 | 5/1980 | Dye et al. | 364/200 |
| 4,241,381 | 12/1980 | Cobough et al. | 361/407 |
| 4,353,469 | 10/1982 | Etchison et al. | 361/415 |
| 4,393,464 | 7/1983 | Knapp et al. | 364/200 |

Primary Examiner—Gareth D. Shaw
Assistant Examiner—Jameson Lee
Attorney, Agent, or Firm—Benoit Law Corporation

[57] ABSTRACT

A bus system architecture and method provides on a substrate a bus line system for first and second circuit boards designed to extend across the substrate. Individually dedicated first, second and third bus lines for the first circuit boards are provided in a first bus line array at one side of the substrate. Individually dedicated fourth, fifth and sixth bus lines for the second circuit boards corresponding, respectively, to the first, second and third bus lines, are provided in a second bus line array representing a mirror image of the first bus line array at an opposite side of the substrate. An area of the substrate between the first and second bus line arrays may be subdivided into sequential first and second regions adjacent the first bus line array, and sequential third and forth regions adjacent the second bus line array. A third bus line array is located in the first region for the first circuit board, and a fourth bus line array in the fourth region for the second circuit boards. Individual connectors may be provided in the second and third regions for the second and first circuit boards, respectively. A microprocessor system that may be combined with the bus system architecture has a first microprocessor controlling a second microprocessor and various peripherals, such as via one of the above mentioned bus line arrays, and has the second microprocessor control further peripherals, such as via another bus line array.

5 Claims, 5 Drawing Figures

Fig. 4

BUS SYSTEM ARCHITECTURE AND MICROPROCESSOR SYSTEM

BACKGROUND OF THE INVENTION

1. Field of the invention

The subject invention relates to data processing and control, to data processing or bus system architectures, to bus line systems and methods for making same.

2. Disclosure statement

The following disclosure statement is made pursuant to the duty of disclosure imposed by law and formulated in 37 CFR 1.56(a). No representation is hereby made that information thus disclosed in fact constitutes prior art, inasmuch as 37 CFR 1.56(a) relies on a materiality concept which depends on uncertain and inevitably subjective elements of substantial likelihood and reasonableness, and inasmuch as a growing attitude appears to require citation of material which might lead to a discovery of pertinent material though not necessarily being of itself pertinent. Also, the following comments contain conclusions and observations which have only been drawn or become apparent after conception of the subject invention or which contrast the subject invention or its merits against the background of developments which may be subsequent in time or priority.

Despite a wide proliferation of data processing and system architectures, needs continue to persist in this area. Although the subject invention addresses itself primarily to microprocessor systems, it is not intended to be limited thereto, but obviously has considerably wider utility.

By way of background a typical microprocessor system architecture comprises data, address and control buses. The data bus carries information to and from the processor element, including instructions fetched from memory, data input from input devices, data stored in memory, and data output going to output devices. By way of example, the address proceeding over the address bus specifies where data are going or coming from, while the control bus is used to control sequencing and nature of operations being performed.

Reference may in this respect be had on standard texts about interfacing techniques, such as the SYBEX book on MICROPROCESSOR INTERFACING TECHNIQUES (2nd ed., 1977, 1978), by Austin Lesea and Rodney Zaks, which in Chapter 6 discusses bus standards and techniques. As an illustration of part of the problem, reference may be had to the following paragraph on page 273 of that book:

"What if a board is unplugged with the power on? The possibility of the −18 volts touching the +8 volts, due to misalignment, is great. If this happens . . . well, let us hope it doesn't. At best, only the regulators may blow out; at worst, every chip tied on +5 volts may be damaged."

The same may be said with respect to an accidental insertion of a circuit board in a reverse fashion, and with respect to similar mishaps.

There also are persistent needs for better system architectures in terms of interfacing peripherals with microprocessors, and in terms of improved busing systems, to name two examples.

In a similar vein, there have been past efforts to share the task of controlling various peripherals between two microprocessors. However, such efforts generally proceeded on an ad hoc basis, tailored to a particular problem. Also, such efforts typically employed a time-sharing concept which placed speed and efficiency limitations on the system. In other words, what was lacking was a systematic approach in terms of a generally applicable system architecture.

SUMMARY OF THE INVENTION

It is a general object of the invention to overcome the disadvantages and to meet the needs expressed or implicit in the above disclosure statement or in other parts hereof.

It is a related object of this invention to provide improved processor system architectures.

It is a germane object of this invention to provide improved bus system architectures and bus boards.

It is also an object of this invention to provide improved microprocessor systems and improved methods for controlling peripherals.

Other objects of the invention will become apparent in the further course of this disclosure.

From one aspect thereof, the subject invention resides in a method providing on a substrate a bus line system for first and second circuit boards designed to extend across the substrate. The invention according to this aspect resides in the improvement comprising in combination the steps of providing at a first region of one major plane of the substrate for the first circuit boards individually dedicated first, second and third bus lines in a first bus line array, extending a portion of said first bus line array over a first part of the substrate, providing at a distinct second region of the substrate for the second circuit boards individually dedicated fourth, fifth and sixth bus lines corresponding, respectively, to said first, second and third bus lines, and being arranged in a second bus line array extending a portion of the second bus line array over a second part of the substrate adjacent the first part, the portion of the second bus line array in the second part of the substrate, representing a mirror image of said portion of the first bus line array in the first part of the substrate, as seen with respect to a plane between the first and second parts perpendicular to said one major plane.

From another aspect thereof, the subject invention resides in the improvement comprising in combination the steps of subdividing an area of the substrate into first and second regions adjacent one edge of said area, and third and fourth regions adjacent another edge of said area, providing in the first region a bus line array for said first circuit boards, providing in the fourth region a separate bus line array for said second circuit boards, providing the bus line array in the first region with individual connectors for the first circuit boards, and providing the separate bus line array in the fourth region with separate individual connectors for the second circuit boards.

From yet another aspect thereof, the subject invention resides in a method of providing on a substrate a bus line system for a first circuit board designed to extend across the substrate and a second circuit board designed to extend also across the substrate, and, more specifically, resides in the improvement comprising, in combination, the steps of providing at a first region of one major plane of the substrate for the first circuit board individually dedicated first, second and third bus lines in a first bus line array, one of the first, second and third bus lines being made different in shape from another of the first, second and third bus lines, and providing at a distinct second region of the one major plane of the substrate for the second circuit boards individually dedicated fourth, fifth and sixth bus lines corresponding, respectively, to said first, second and third bus lines, and being arranged in a second bus line array representing a mirror image of the first bus line array as seen with respect ot a plane perpendicular to the one major plane.

The subject invention also extends to combinations of the two aspects just recited, as well as to various circuit board structures.

From a further aspect thereof, the invention resides in methods and apparatus for controlling peripherals in a microprocessor system, and, in particular, resides in the improvement comprising, in combination, the steps of, or means for, dividing the peripherals into first and second groups of peripherals, providing distinct first and second microprocessors, constituting the second microprocessor as a peripheral of the first microprocessor, controlling the second microprocessor and the first group of peripherals with the first microprocessor and controlling the second group of peripherals with the second microprocessor.

Other aspect of the invention will become apparent in the further course of this disclosure, and no limitation to any specific method, step, apparatus, component or aspect is intended by this brief summary of the invention.

BRIEF DESCRIPTION OF THE DRAWINGS

The subject invention and its various objects and aspects will become more readily apparent from the following detailed description of preferred embodiments thereof, illustrated by way of example in the accompanying drawings, in which like reference numerals designate like or functionally equivalent parts, and in which.

DESCRIPTION OF PREFERRED EMBODIMENTS

Figure 1:
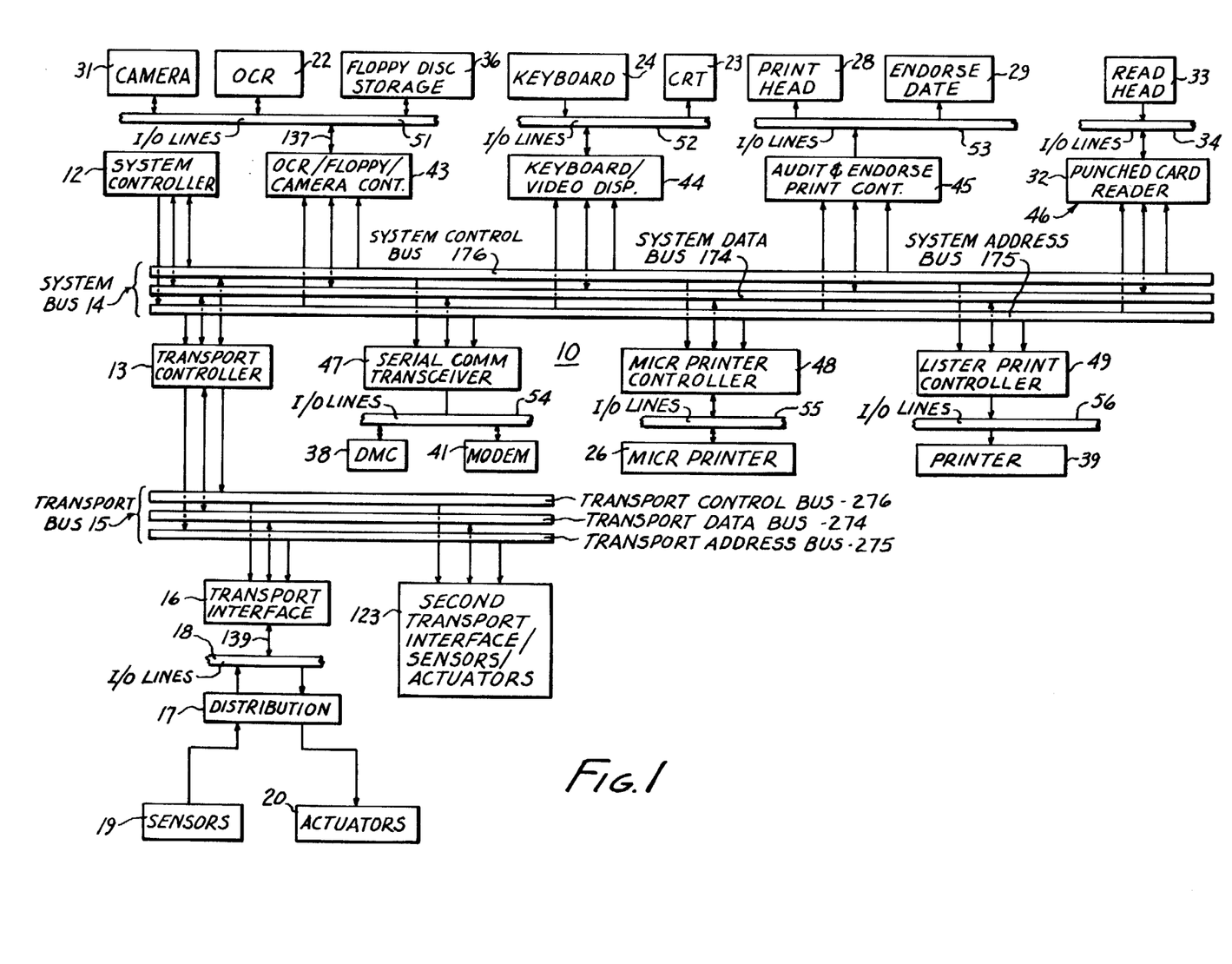
FIG. 1 is a block diagram of a microprocessor system according to a preferred embodiment of the subject invention.

The microprocessor system 10 shown in FIG. 1 according to a preferred embodiment of the invention employs a systems architecture of wide utility. By way of example, the system is herein explained with reference to a remittance processing system or terminal.

For instance, terminals embodying the system of FIG. 1 may aid public utilities and financial institutions in processing and properly registering payments received from customers, such as in the form of checks and corresponding payment stubs separated by customers from invoices received by them. In these and other transactions, it is very important that no mistake occur as to amounts debited and credited to customers. Also, a remittance processing system should give customers prompt credit of their payments, thereby calling for a highly efficient terminal.

The accompanying drawings present phases of a realization of the latter requirements, by way of example, and not by way of limitation.

In terms of architecture, the system 10 preferably embodies a real-time task scheduler which initiates various tasks at fixed rates. Timing information may be provided for each task by the rate at which it is initiated. Tasks may be designed using a state machine concept, which divides a task into functional units called "states," with orderly transitions being defined between states. The state machine concept embodies an initiation of tasks at fixed rates to obtain timing information.

The system 10 preferably uses two microprocessors for performing its function; one being located, for instance, in a system controller 12, and the other in a transport controller 13. The system controller is the main processor, embodying the application program and all of the software peripheral drivers, and generating and sending commands to all the peripheral controllers.

The transport controller 13 may be treated as one of the peripheral controllers, and monitors and controls the document flow or paper flow through the remittance processing system. The interface between the two microprocessors at 12 and 13 may be similar to the other device interfaces, and the transport controller 13 may be treated as just another peripheral device within the illustrated system.

The system 10 has two separate buses, a system bus 14 under the control of the system controller 12 and a transport bus 15 under the control of the transport controller 13.

The system controller 12 and the transport controller 13 can communicate with each other via the system bus 14, under the control of an operating system consisting of two parts; one for the system and the other for the transport. As already indicated, microprocessors may be included in the controllers 12 and 13 in this respect.

An example of the utility of the system 10 may be realized by visualizing the passage of a document, such as a payment stub or check, from a load station through the transport to its final destination in a remittance processing terminal. Such document passage proceeds under the control of the transport controller 13, working through a transport interface 16 and distribution 17 via input/output (I/O) lines 18.

The distribution 17 receives signals from various sensors 19 along the document path, and selectively energizes various actuators 20.

For instance, operation of a document conveyor system may be initiated under the control of systems controller 12 and transport controller 13. A sensor at 19 then may indicate to the distribution 17 that a document has been inserted by an operator into the loading station. At the appropriate time determined via transport controller 13, the distribution 17 may then energize an actuator at 20, such as a document gate, which then permits the document to proceed along the conveyor, to be subjected to various tasks, operations and functions.

For instance, the gated document may be transported on an optical character reader (OCR) for the reading of data from the transported documents. For instance, in the case of a remittance slip, the OCR 22 may read the particular account number and the debited amount from the transported document. Information of that kind may also be read from bank checks and similar documents.

The data read by the OCR 22 may be displayed by a cathode ray tube (CRT) 23. An operator may then compare such displayed data with data actually present on the transported document, and may input corrections and other relevant data through a keyboard 24. For instance, the operator may also input the amount actually paid by the particular invoiced customer, for display at the CRT 23 and data processing in the system.

The transport may then advance the document to a MICR printer 26 for the provision of information on the transported documents. For instance, in the case of a payment check, information on the amount of the check may be printed thereon at 26.

Relevant audit information may also be printed on the transported document. For instance, checks and remittance slips may be transported to a print head 28 for the imprint of information facilitating accounting and auditing of payments made.

Endorse date printer 29 may be employed for endorsing such instruments as payment checks.

The transported documents are preferably presented to a microfilm camera 31 which establishes a permanent record of each payment check and other documents.

In a practical system, information may be input not only via OCR 22 and keyboard 24, but also through the use of such auxiliary devices as a punched card reader 32 having a read head 33 connected thereto through I/O lines 34, for the reading of information from punched cards. By way of example, the punched card reader 32 may supplement or replace the OCR 22.

In addition to the memories of the microprocessors in the system controller 12 and transport controller 13, a large-scale data storage device, such as a floppy disc random access memory 36 may be employed in the system 10 for the storage of program and other information.

System programming and other data may be derived from a data management center (DMC) 38 which may also receive information derived by the system from transported documents and from components 22, 24 and 32.

The system 10 may be provided with a further printer 39 which establishes lists of remittances and of similar data for statistical and other purposes.

Data derived by the system 10 may also be applied to a transceiver or modem 41 for a transmission to remote data processing centers, from which information may also be received for the system 10 via that modem 41.

The system 10 according to the illustrated preferred embodiment of the invention uses individual circuit boards for the system controller 12, for the transport controller 13 and for the peripherals. For instance, a common peripheral circuit board 43 is provided for the OCR 22, camera 31, and floppy disc storage 36. A further common circuit board 44 is provided for the CRT 23 and keyboard 24. A further peripheral circuit board 45 is provided for the print head 28 and endorser 29.

The punched card reader circuitry 32 may be located on a distinct peripheral circuit board 46. A serial communication transceiver circuit board 47 may be provided for the DMC 38 and modem 41. The MICR printer 26 has a MICR printer controller circuit board 48 associated therewith. Similarly, a lister printer controller board 49 is associated with the list printer 39.

The various peripherals are interconnected with their circuit boards through input-output or I/O lines, some of which have already been mentioned, such as as at 18 and 34, while others are shown at 51 to 56.

The various peripherals and their circuit boards 43 to 49 may be conventional types, being composed of state-of-the-art components in a manner known per se.

One aspect of the subject invention addresses itself to the task of accommodating the various circuit boards in the best possible manner in an advanced system architecture and bus system.

Figure 2:
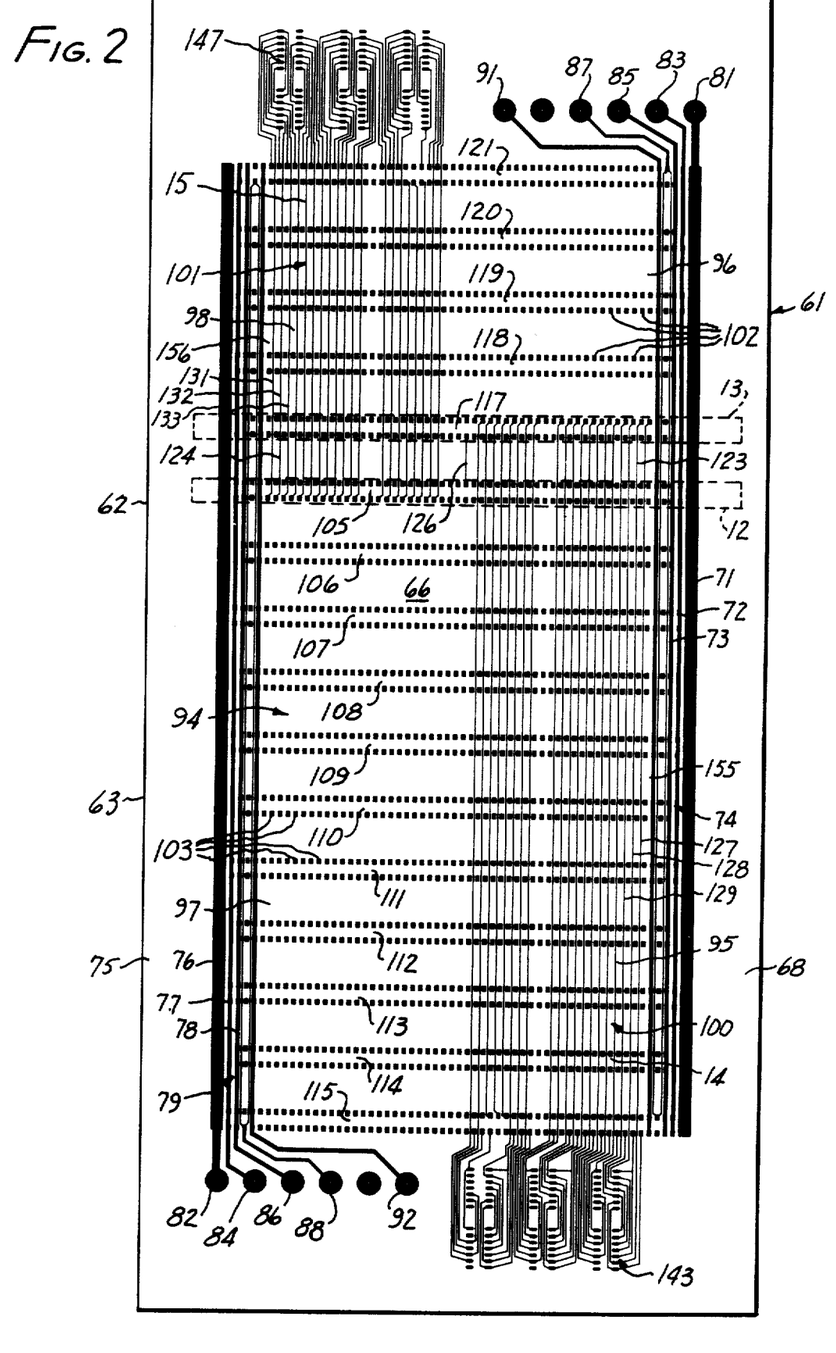
FIG. 2 is an elevation of a bus system according to a preferred embodiment of the subject invention.
Figure 3:
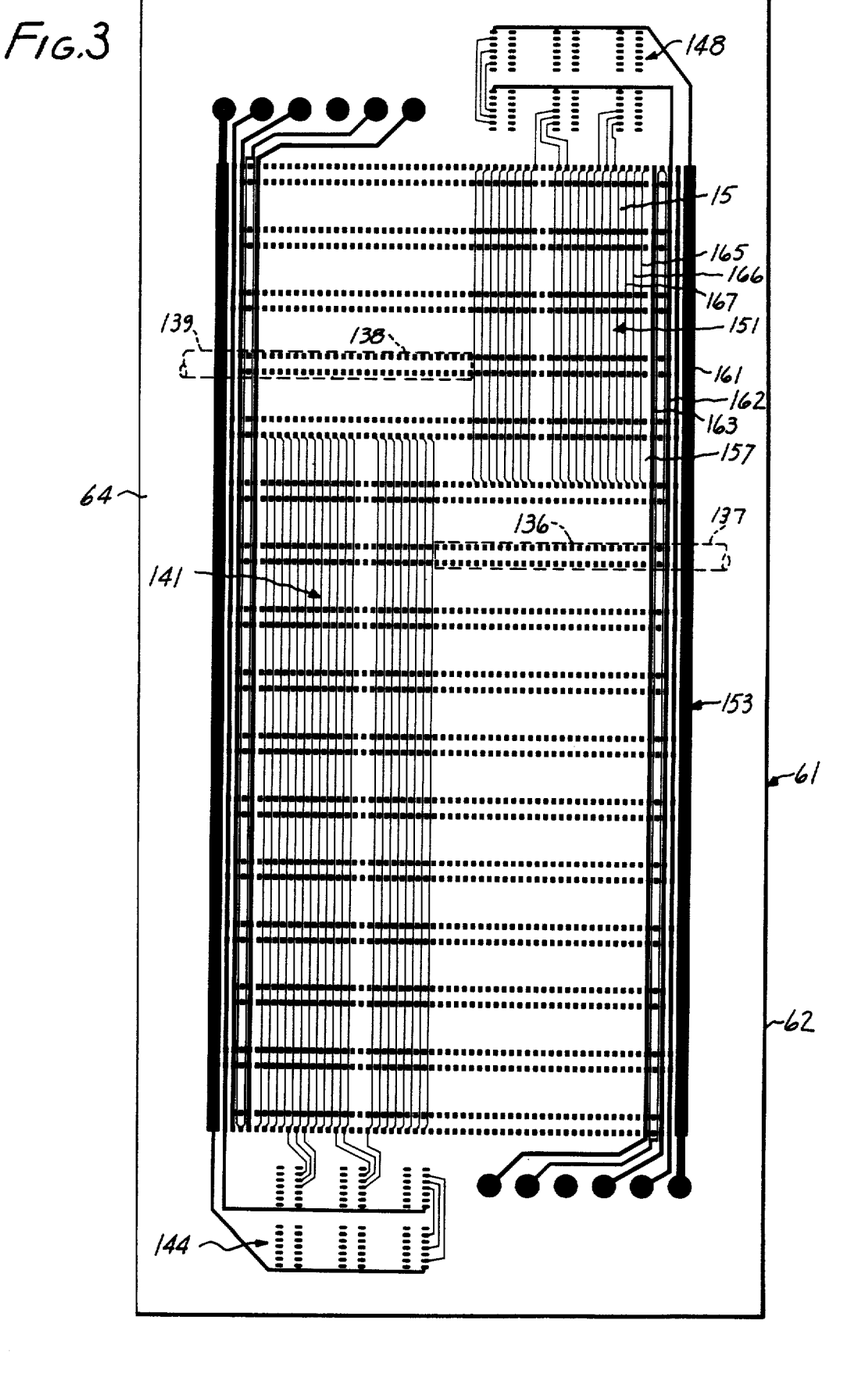
FIG. 3 is a rear view of the bus system shown in FIG. 2, also in accordance with a preferred embodiment of the subject invention.

In this respect, FIGS. 2 and 3 show the front and back side, respectively, of a bus system or board 61 according to a preferred embodiment of the subject invention. By way of example, the embodiment shown in FIGS. 2 and 3 may be employed to provide the system bus 14 and transport bus 15, as well as power supply buses in the system 10 of FIG. 1. It should, however, be understood that the aspect of the invention shown in FIGS. 2 and 3 has utility independent of the system 10 and may be employed in a wide variety of applications where bus systems are advantageously used.

The system 61 has a substrate or board 62 having a front side 63 seen in FIG. 2, and a back side 64 seen in FIG. 3. Essentially identical and mutually registering bus line systems are applied to the front and back sides of the substrate 62. In practice, this is preferable, inasmuch as it realizes a distribution of the requisite cross sections of the bus lines over two areas, whereby the bus line density may correspondingly be increased on both sides 63 and 64. It should, however, be understood ) that the bus line system according to the subject invention need only be applied to one side of the substrate, if desired. Accordingly, since the subject invention has method and apparatus aspects, FIG. 2 presently will be employed primarily in conjunction with a disclosure of a method of providing a bus system, while FIG. 3 will be used primarily to describe various aspects of the bus system itself.

In particular, the illustrated method provides on substrate 62 a bus line system 66 for first and second circuit boards 12 and 13 designed to extend across the substrate 62 to at least some extent. The illustrated method then provides at one side or edge region 68 of the substrate 52 for the first circuit board or boards 12 individually dedicated first, second and third bus lines 71, 72 and 73 in a first bus line array 74. As seen in the drawings, one of these first, second and third bus lines, such as the bus line 71 or the bus line 72, is made different in shape from another of these first, second and third bus lines, such as the bus line 72 or the bus line 71, respectively.

Similarly, the method according to the illustrated aspect of the invention provides at an opposite side or edge region 75 of the substrate 62 for the second circuit board or boards 13 individually dedicated fourth, fifth and sixth bus lines 76, 77 and 78 corresponding, respectively, to the first, second and third bus lines 71, 72 and 73, in a second bus line array 79 representing a mirror image of the first bus line array 74.

In this manner, circuit boards may be used interchangeably in a reversed manner. Also, no damage to any circuit board will arise if it is plugged in on the board 62 upside down from its intended orientation.

In this respect, the bus bars or lines 71 and 76 may, for instance, be ground lines and, for this purpose, may be connected to ground terminals 81 and 82. Lines 72, 73, 77 and 78 may be power supply lines. For instance, lines 72 and 77 are connected to terminals 83 and 84 which may receive a positive power supply potential that is not interrupted, so as to keep the memories in the system and transport controllers 12 and 13 intact. Lines 73 and 78 have terminals 85 and 86 which, for instance, may be connected to a positive power supply potential that is interrupted when the system is not actively operating.

Further bus lines connected to terminals 87, 88, 91 and 92 may be provided, as seen in FIG. 2, for such purposes as a supply of negative or higher negative and positive potentials to the circuit boards on the bus system 61. Such additional bus lines preferably are also arranged as a mirror image of corresponding bus lines in the opposite array 74 or 79.

The mirror image concept of the currently discussed aspect of the invention may also or alternatively be applied to other bus lines in the system 61.

In this respect, and according to an illustrated preferred embodiment of the invention, an area 94 of the substrate 62 is subdivided into first and second regions 95 and 96 alternating adjacent one edge 68 of the area 66, and third and fourth regions 97 and 98 alternating adjacent another edge 75 of the area 66 In this respect, the third region 97 is adjacent the first region 95, and the fourth region 98 is adjacent the second region 96 in the embodiment shown in FIG. 2. The currently discussed aspect of the invention provides in the first region 95 a bus line array 100 for the first circuit boards including the board 12, and in the fourth region 98 a separate bus line array 101 for the second circuit boards, including the board 13. The currently discussed aspect of the invention further provides in the second region 96 and fourth region 98 individual connectors 102 for the second circuit boards, including the board 13, and in the first region 95 and third region 97 individual connectors 103 for the first circuit boards, including the circuit board 12. In particular, in the embodiment shown in FIG. 2, the bus line array 100 is provided in the first region 95 with individual connectors 103 for the first circuit boards 12 etc., and the bus line array 101 is provided in the fourth region 98 with individual connectors 102 for the second circuit boards 13 etc.

It may be helpful at this point to consider a practical example of utility of the bus system 61 with reference to FIG. 1.

In particular, while FIG. 2 shows the system controller circuit board 12 plugged into a first double row of connectors 105, the peripheral boards 43, 44, 45, 46, 47, 48 and 49 may be plugged individually into the double row of connectors 106, 107, 108, 109, 110, 111 and 112, respectively. Several spare rows of connectors 113, 114 and 115 may be provided to permit expansion of the system, as desired.

Similarly, while FIG. 2 shows the transport controller board 13 plugged into a double connector row 117, the transport interface board 16 may, for instance, be plugged into the additional row 118. Further spare rows 119, 120 and 121 are provided in the transport bus area of the system 61, in order to enable an expansion of the system by the provision of further boards, such as a second transport interface board 123 indicated in FIG. 1. In practice, such a second transport board may, for instance, be employed to multiply the document handling or stacker facility.

Chief features of the embodiment described with reference to FIG. 2 may advantageously be employed in combination according to a further embodiment of the invention. For instance, the area 66 of the substrate 62 may be subdivided between the first and second bus line arrays 74 and 79 into alternating first and second regions 95 and 96 adjacent the first bus line array 74, and into alternating third and fourth regions 97 and 98 adjacent the second bus line array 79. There may then be provided in the first region 95 a third bus line array 100 for the first circuit boards, and in the fourth region 98 a fourth bus line array 101 for the second circuit boards. Individual connectors for the second circuit board may again be provided in the second region 96, and individual connectors for the first circuit boards in the third region 97.

By way of example, the third bus line array may in fact be the system bus 14, and the fourth bus line array 101 the transport bus 15 of the system 10 shown in FIG. 1.

According to a further embodiment of the invention, the third bus line array 100 or system bus 14 is extended into part of the second region 96, as shown at 123 in FIG. 2. Similarly, the fourth bus line array 101 or transport bus 15 is extended into part of the third region 97, as seen at 124.

As seen in FIG. 2, the extension of the bus line arrays 100 and 101 or system and transport buses 14 and 15 may overlap at 123 and 124. In this manner, the system controller 12 may communicate not only with the peripheral boards 43 to 49, but also with the transport controller 13 via the buses 100 and 101. The transport controller 13 may thus constitute in effect a peripheral of the system controller 12.

The transport controller 13, in turn, may communicate with the transport peripherals 16 and 123 via the transport bus 15 or 101.

The mirror image concept according to a preferred embodiment of the subject invention advantageously may also be applied to the system and transport buses 14 and 15 or third and fourth bus line arrays 100 and 101. By way of example, either of the system and transport buses 14 and 15 or third and fourth bus line arrays 100 and 101 may be made to present a laterally shifted mirror image of the other of these buses 14 and 15 or bus line arrays 100 and 101, as seen in FIG. 2. In practice, this enables first and second circuit boards to be used interchangeably in a reverse position.

The first to sixth bus lines 71 to 73 and 76 to 78, or the first and second bus line arrays 74 and 79 may be made coextensive over the board to serve as power supplies for either of the first and second circuit boards.

The bus line arrays may be provided with individual connectors 105 and 117 in the overlapping area of the first and fourth or second and third regions 95 and 98 or 96 and 97, for connection to at least one circuit board 12 or 13 straddling the system and transport buses 14 and 15 or bus line arrays 100 and 101.

One or more bus lines or connections may, if desired, be added to the circuit board system in addition to the mirror-image duplicated bus line arrays. For instance, a line 126 may be provided between the connectors 105 and 117 in order to provide for a transmission of timing information or clock signals between the system and transport controllers 12 and 13.

So far, the bus lines 71 to 73 in the array 74 and the bus lines 76 to 78 in the array 79 have been designated as first to sixth bus lines. However, bus lines in the array 100 and 101 may be so designated also. For instance, the system bus 14 or bus line array 100 may have first, second and third bus lines 127, 128 and 129, while the transport bus 15 or bus line array 101 may have fourth, fifth and sixth bus lines 131, 132 and 133.

In that case, the latter fourth, fifth and sixth bus lines 131, 132 and 133 may again correspond to the first, second and third bus lines 127, 128 and 129 in a laterally offset mirror-image array.

As shown in FIG. 2, the fourth, fifth and sixth bus lines 131, 132 and 133 are staggered relative to the first, second and third bus lines 127, 128 and 129. Such staggering may be carried out in a partially overlapping relationship, as seen at 123 and 124 in FIG. 2. In particular, a portion of the bus line array 100 including the first, second and third bus lines 127, 128 and 129 is extended over a first part 123 of the substrate 62, while a portion of the bus line array 101 including the fourth, fifth and sixth bus lines 131, 132 and 133 is extended over a different second part 124 of that substrate, with said second part 124 being adjacent said first part. As seen in FIG. 2, the portion of the second bus line array 101 in the second part 124 of the substrate represents a mirror image of the portion of the first bus line array 100 in the first part 123 of the substrate as seen with respect to a plane perpendicular to the major plane of the substrate seen in FIG. 2; such perpendicular plane lying between the substrate parts 123 and 124. The second array 101 thus includes a representation of mirror image of the first array 100 with respect to the latter perpendicular plane.

The connector elements so far described and shown, such as at 105 to 115 and 117 to 121, preferably extend through the substrate or circuit board 62 as terminals. Connector pins which extend through the substrate or board 62 may be employed for that purpose.

In this manner, the circuit boards 12, 13, 16, 43, etc., may be applied to the front surface of the bus system board 51 as seen in FIG. 2, at right angles thereto, while plug-in connectors may then be applied at the rear side of the board 61, as seen in FIG. 3. By way of example, FIG. 3 indicates a female connector 136 applied to the terminal pins at the rear side of the substrate 62 in order to connect a circuit board, such as the board 43, to the corresponding periperal or peripherals, via a cable 137 indicated in FIGS. 1 and 3.

Similarly, FIG. 3 shows a female connector 138 applied to the rear of the transport bus region of the board 51, in order to connect a circuit board, such as the transport interface board 16, to its peripherals via a cable 139 shown in FIGS. 1 and 3.

The bus system 141 shown in FIG. 3 as applied to the rear side of the board 61 in effect is a mirror-image of the bus system shown in FIG. 2 as being applied to the front surface of the same board or substrate. In this manner, the bus systems shown in FIGS. 2 and 3 may be provided in exact registry on the board 51 or substrate 62, so as to form a composite bus system thereon.

Except for their mirror-image relationship, the component bus systems shown in FIGS. 2 and 3 may essentially be identical, except perhaps for certain modifications.

For instance, different first and second components of a composite connector system may be provided on the front and rear portion of the board 61 or substrate 62. In this respect, a first part 143 of a circuit and connector arrangement may be provided at the front side as seen in FIG. 2, with a corresponding and partially registering second part 144 of that arrangement being provided at the rear part of the board, as seen in FIG. 3. In this manner, the parts 143 and 144 may be connected to different components of the bus system 61, such as to the bus line array 100 and to the rear counterpart of the bus line array 74, respectively. The parts 143 and 144 are interconnected through the substrate 62 and may serve such purposes as an interconnection with termination resistors for noise abatement. A similar arrangement is also shown for the transport bus at 147 and 148 in FIGS. 2 and 3, respectively.

As indicated above, the bus system need not be duplicated on both sides of the board, but may, if desired, be provided on one side only. Apart from the similarities and differences so far indicated, the bus system component shown in FIG. 3 need not herein be described in greater detail.

An important feature should, however, be noted at this point and in general. By way of background in this respect, it is, of course, true that FIGS. 2 and 3 present the essentially duplicate front and rear components of the bus system 61 as mirror images of each other, and that such an arrangement may be employed in carrying out the subject invention.

However, the important point in this respect is that part of the bus system may be provided on one side of the substrate or board 62 and the remainder of that bus system 61 may be provided on the other side of the board 62, with such part and such remainder still representing mirror images of each other as seen with respect to either of the latter one and other sides.

By way of example, it is possible within the scope of the subject invention that, for instance, the bus line array 100 or system bus 14 is provided only on the front side of the board 62, shown in FIG. 2, while the bus line array 101 or transport bus 15 is only provided on the rear side of the board 62, shown in FIG. 3. Even in such a case, the arrays 100 and 101 would be mirror images of each other, as seen with respect to one reference plane, such as the front side of the board 62.

In this respect, it is correct that the rear side component 151 of the transport bus 15 presents in FIG. 3 a mirror image of the front component 101 of that transport bus. The point with respect to the currently discussed aspect of the invention is, however, that the rear bus line array 151 of the transport bus 15 represents a mirror image of the front bus line array 100 of the system bus 14, as seen with respect to one of the major planes of the board 62, such as the front major plane shown in FIG. 2.

For instance, if the board 62 is transparent, then the bus line array 151 applied to the rear side of the board would be seen through such transparent board from the front side thereof as a mirror image of the bus line array 100 applied to that front side. Of course, such mirror image relationship could still be present, even if the board 62 were opaque. In either case, the mirror image presented by the bus line array 151 would in the embodiment shown in FIGS. 2 and 3 be laterally offset from, and would also be somewhat shorter than, the bus line array 100. However, it would be a mirror image, nevertheless, as the bus line array 79 presents a mirror image of the bus line array 74.

Incidentally, it is within the scope of the subject invention to provide instead of a bus line array 79 shown on the front side of the board 62 only a corresponding bus line array 153 on the rear side of the board, as shown in FIG. 3. There again, the array 153 would constitute a mirror image of the array 74, as seen from or with respect to the front major surface of the board 62.

The currently discussed aspect of the invention thus provides at a first region 155 of one major plane 63 of the substrate or board 62 for the first circuit boards 12 and 43 to 47 individually dedicated first, second and third bus lines 71, 72 and 73 or 127, 128 and 129 in a first bus line array 74 or 100, and further provides at a distinct second region 156 or 157 of the substrate or board 62 for the second circuit boards 13, 16 and 123 individually dedicated fourth, fifth and sixth bus lines 76, 77 or 78 or 131, 132 and 133 or 161, 162 and 163 or 165, 166 or 167 corresponding, respectively, to particular first, second and third bus lines, and being arranged in a second bus line array 79 or 101 or 153 or 151, respectively, representing a mirror image of the first bus line array 74 or 100, as seen from or with respect to the one major plane 63 on which the region 155 is located.

According to a preferred embodiment of the subject invention, electrical connectors or pins 105 to 155 and 117 to 121 extend through the board and in part individually contact the various bus lines so that circuit boards 12, 13, 16 and 43 to 47 may be arranged on one side of the board, such as the major surface 63, while individual connectors 163, 138, etc., may be attached to the connectors at the other side 64 of the board 62. Of course, other variations within the broad spirit and scope of the subject invention are possible.

In terms of structure, the subject invention provides a bus line system 61 for first circuit boards 12 and 43 to 47 and second circuit boards 13, 16 and 123 designed to extend across the bus line system. According to the presently discussed aspect the invention, the bus line system 61 comprises a board or substrate 62 and individually dedicated first, second and third bus lines 71, 72 and 73 or 127, 128 and 129 in a first bus line array 74 or 100 at a first region 155 of one major plane 63 of the substrate 62 for the first circuit boards 12 and 43 to 47. According to the disclosed invention, the bus line system 61 also includes individually dedicated fourth, fifth and sixth bus lines 76, 77 and 78 or 131, 132 and 133 or 161, 162 and 163 or 165, 166 and 167 located in a distinct second region 156 or 157 of the substrate 62 and corresponding, respectively, to the particular first, second and third bus lines, and being arranged in a second bus line array 79 or 101 or 153 or 151 representing a mirror image of the particular first bus line array 74 or 100, respectively, as seen from or with respect to the one major plane 63.

The subject invention similarly extends to bus line systems or structure as disclosed herein in the description of FIGS. 2 and 3.

Figure 4:
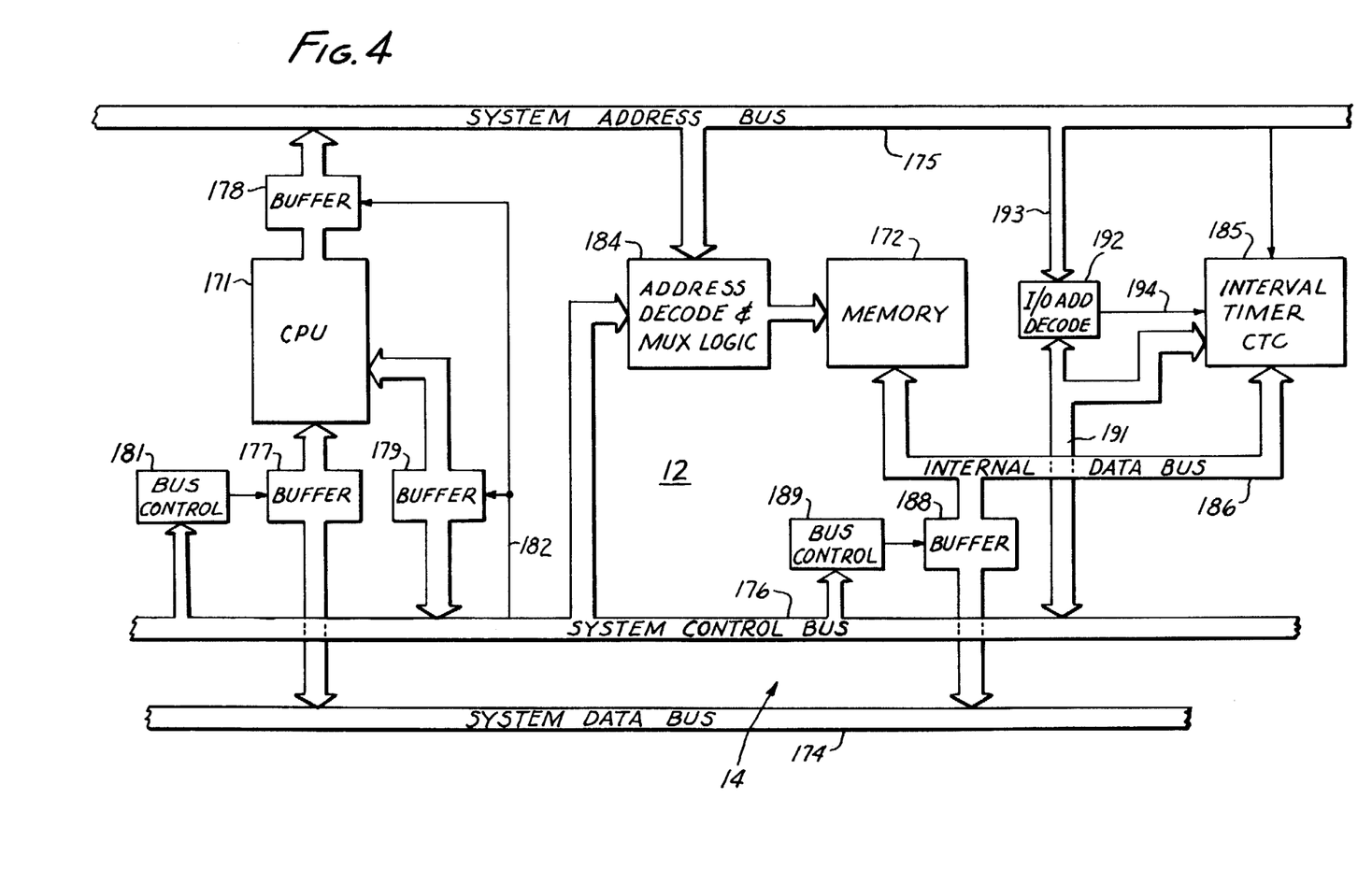
FIG. 4 is a block diagram of a system controller which may be employed in the microprocessor system of FIG. 1 according to an embodiment of the subject invention.

Turning now to FIG. 4, an example of a system controller 12 is shown therein. According to this illustrated example, the system controller 12 includes a central processing unit (CPU) or microprocessor 171 and a memory 172. The CPU 171 may, for example, be of a standard type, such as the well-known Zilog Z-80, Intel 8080, Motorola 6800, Signetics 2650, to name a few examples.

The memory 172 may also be of a conventional type, including random access memory elements (RAM) for such tasks as data storage, and read-only memory elements (ROM) or electrically erasable read-only memory elements (EPROM) for such matter as programs and fixed data.

The system controller 12 is connected to or includes the system bus 14, comprising in the illustrated example a system data bus 174, a system address bus 175 and a system control bus 176. As previously indicated, the system bus 14 may in practice be realized within the bus system 61 shown FIGS. 1 and 2, such as by the bus lines 127, 128 and 129 or by more or other lines of the bus array 100 or 141.

The system data bus 174 carries information to and from the CPU 171. For instance, the data bus 174 carries instructions fetched from memory 172, data stored into memory, data input from from input devices or peripherals, such as the peripheral boards 43 to 49 or the transport controller 13, and data going to output devices or peripherals, such as the mentioned boards 13 and 43 to 49.

The address bus 175 carries addresses which specify where the data are going or where they are coming from. Such addresses may select a location in memory 172 or a register of an input-output (I/O) device.

The system control bus 176 carries signals controlling the sequencing and nature of operations to be performed and effecting other well-known control functions to implement scheduling and synchronization of events.

The CPU 171 is interconnected with the data bus 174, address bus 175 and control bus 176 via buffers 177, 178 and 179, respectively.

In the example shown in FIG. 4, the buffer 177 is controlled from the system control bus 176 by a bus control 181, which may regulate the flow of data to and from the system data bus 174. The buffers 178 and 179 may be controlled from the system control bus 176 via line 182 effecting a tristate operation characterized by high, low, and open circuit states. In practice, tristate operation permits the use of a direct memory access controller (DMAC). Also, any board may be in an open circuit condition and may thus effectively be disconnected when its address is not on the address bus 175.

The address bus 175 and the control bus 176 also lead to an address decode and multiplex logic 184 which acts on the memory 172, as indicated in FIG. 4.

The system controller 12 shown in FIG. 4 also includes an interval timer or control timer chip (CTC) 185 and an internal data bus 186 extending between the memory 172 and the CTC 185, and being also connected to the system data bus via a buffer 188.

The buffer 188 is controlled by a bus control 189 which receives control signals from the system control bus 176, as seen in FIG. 4.

The system control bus 176 and CTC 185 are interconnected via a line 191 which also extends to an input-/output (I/O) address decoder 192, having an input connected to the system address bus 175 at 193 and having an output 94 connected to the CTC 185.

In practice, the CTC 185 may keep a program running in steps to perform a series of operations at regular intervals or may perform other subroutines.

Figure 5:
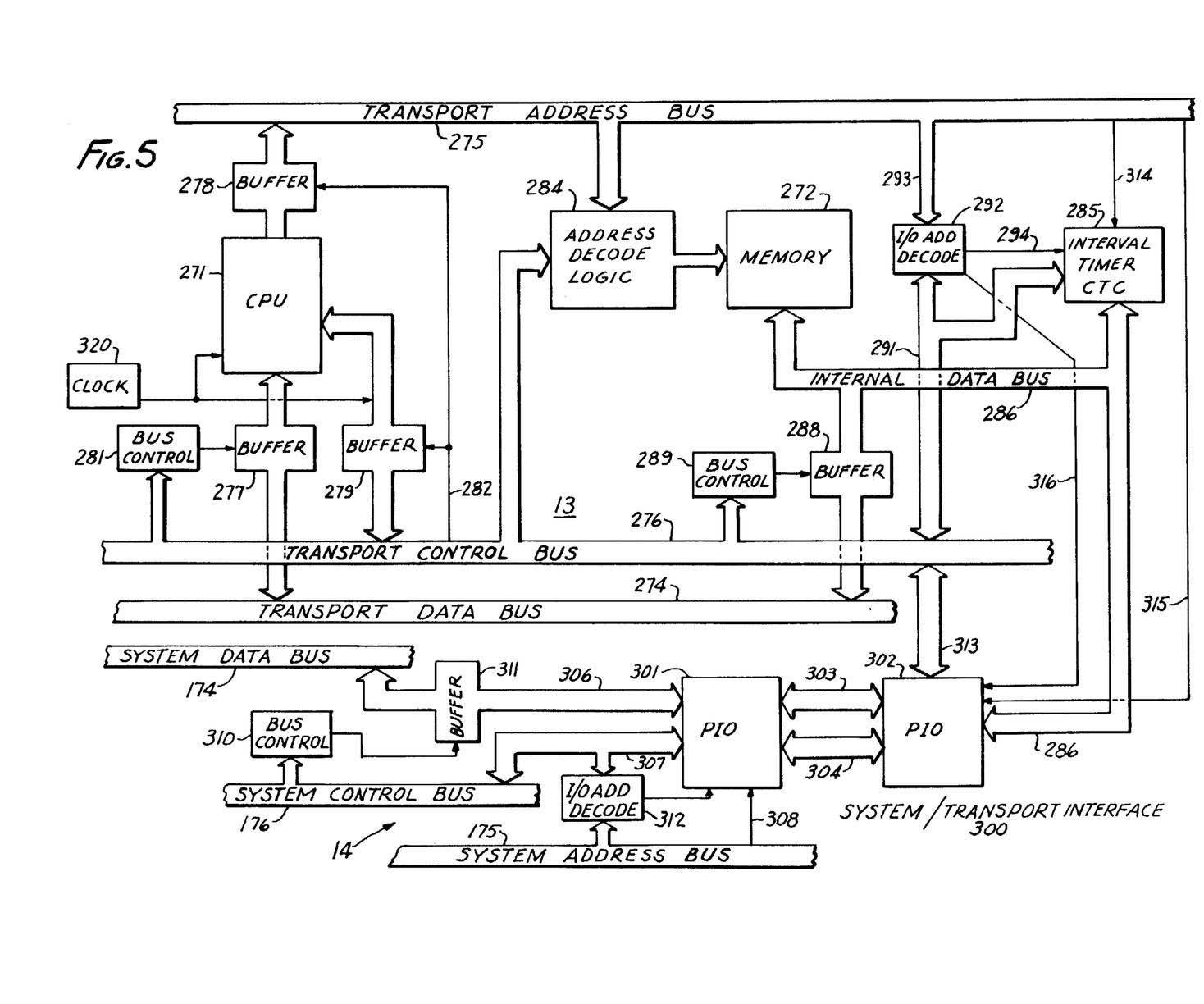
FIG. 5 is a block diagram of a transport controller that may be employed in conjunction with the system controller according to an embodiment of the subject invention.

According to the preferred embodiment of the invention shown in FIG. 5, the transport controller 13 is similar to the system controller 12 in many respects. Accordingly, like or functionally equivalent components as among the system and transport controllers shown in FIGS. 4 and 5 are designated by similar reference numerals, with a "2" having been substituted in the reference numerals for the transport controller 13 in FIG. 5 for the initial "1" in the reference numerals of corresponding components shown in FIG. 4.

It is thus seen that the preferred transport controller 13 shown in FIG. 5 has a central processing unit (CPU) or microprocessor 271, a memory 272, a transport data bus 274, a transport address bus 275, a transport control bus 276, buffers 277, 278, 279 and 288, bus control 281, line 282, address decode logic 284, interval timer or control timer chip (CTC) 285, internal data bus 286, bus control 289 and address decoder 292 corresponding, respectively, to, and interacting in the manner of, the above mentioned system controller components 171, 172, 174, 175, 176, 177, 178, 179, 188, 181, 182, 184, 185, 186, 189, 191, 192, 193 and 194.

In similarity to the address decoder 192 of the system controller, the address decoder 292 of the preferred transport controller 13 has an input connected to the transport address bus 275 at 293 and an output 294 connected to the CTC 285.

Also in similarity to the system bus, the transport bus 15, including transport data, address and control buses 274, 275 and 276, may in practice be realized within the bus system 61 shown in FIGS. 1 and 2, such as by bus lines 131, 132 and 133 or by more or other lines of the bus array 101 or 151. Similarly, the system controller may be on a board indicated at 12 and the transport controller may be on a board indicated at 13, on the bus system 61 or bus system board 12, in FIG. 2.

According to a further aspect of the illustrated preferred embodiment shown in FIG. 5, the microprocessor system 10 has a system/transport interface 300 between the system and transport controllers 12 and 13 or system and transport buses 14 and 15. As seen in FIG. 5, the interface 300 includes a parallel input/output device (PIO) 301 and a parallel input/output device (PIO) 302 for bidirectional parallel data transfer between the system control and transport control sides. To this end, the PIO 301 and PIO 302 have input and output ports, and output and input ports, respectively, interconnected through lines 303 and 304, as seen in FIG. 5.

The input/output device 301 interfaces with the system data bus 174, system control bus 176 and system address bus 175, shown in FIGS. 4 and 5, via lines 306, 307 and 308. Data transfer between the system data bus 174 and the PIO 301 is controlled from the system control bus 176 via a bus control 310 and a buffer 311.

An input-output (I/O) address decoder 312 is associated with the PIO 301, being connected to the system address bus 175, lines 307 and PIO 301, as seen in FIG. 5.

The PIO 302 interfaces with the transport control bus 276 via lines 313 and also has an extension of the internal transport data bus 286 connected thereto. Lines 314 and 315 lead from the transport address bus 275 to the transport CTC 285 and PIO 302, with the same input/output address decoder 292 acting on such CTC 285 and PIO 302 via lines 294 and 316, respectively.

Within the scope of the illustrated preferred embodiment of the subject invention, the system and transport controls of FIGS. 4 and 5 should be considered tied together via bus lines 174, 175 and 176, shown in both of these figures.

A clock 320 may be associated with the microprocessor system 10 for timing and synchronizing all functions. As shown by way of example in FIG. 5, the clock 320 may be associated with the CPU 271 in the transport controller 13. The clock signal may be transmitted through the bus system, such as through the control buses. Also, as indicated above in connection with FIG. 2, a separate line 126 may be employed for transferring a clock signal between the system and transport control boards 12 and 13.

The illustrated preferred embodiment of the invention provides a first microprocessor, shown by way of example in FIG. 4, on one of the first circuit boards, such as the board 12 shown in FIGS. 1 and 2, and a second microprocessor, as shown by way of example in FIG. 5, on one of the second circuit boards, such as the board 13 shown in FIGS. 1 and 2. The illustrated preferred embodiment constitutes the second microprocessor as a peripheral of the first microprocessor.

This may, for instance, be accomplished in a manner apparent from FIG. 5.

First peripherals, such as the peripherals 22, 23, 24, 26, 28, 29, 31, 33, 36, 38, 39 and 41, may be connected to any remaining first circuit boards, such as, respectively, to the boards 43 to 49 shown in FIG. 1

Second peripherals, such as the peripherals 19 and 20 and other peripherals within the block 123, are connected to any remaining second circuit boards, such as the transport interface board 16 and a similar board within the block 123, shown in FIG. 1.

The illustrated preferred embodiment of the invention then controls the second microprocessor at 13 and the first peripherals 22 etc., with the first microprocessor at 12 via one of the bus line arrays, such as the system bus array 14. The illustrated preferred embodiment further controls the second peripherals 19 etc., with the second microprocessor at 13 via another of the bus line arrays, such as the transport bus array 15.

The illustrated embodiment of the invention, from one aspect thereof, thus resides in apparatus for controlling first peripherals, such as the above mentioned peripherals 22 etc., for transferring data relative to a document and second peripherals, such the above mentioned peripherals 19 etc., for transporting the document along the first peripheral, in a microprocessor system 10. The embodiment according to this aspect resides in particular in the combination of distinct first and second microprocessors, means including the system/transport interface 300 for constituting the second microprocessor, shown by way of example in FIG. 5, as a peripheral of the first microprocessor, shown by way of example in FIG. 4, means including, for instance, the system bus 14, for connecting the first microprocessor to the second microprocessor and to the mentioned first peripherals for a control of the second microprocessor and the first peripherals 22 etc., by the first microprocessor, shown by way of example in FIG. 4, and means including, for example, the transport bus 15 for connecting the second microprocessor to the second peripherals 19 etc., for a control of such second peripherals by the second microprocessor.

The subject invention is, of course, not limited to any illustrated embodiment thereof. For instance, the subject invention may be employed in methods and apparatus for controlling peripherals in a microprocessor system. In this respect, the invention may be embodied in a combination which provides distinct first and second microprocessors without limitation to the microprocessors shown in FIGS. 4 and 5, constitutes the second microprocessor as a peripheral to the first microprocessor without limitation to the system/transport interface 300 shown in FIG. 5, provides distinct first and second bus line system without limitation to the system and transport buses 14 and 15 shown in the drawings, divides the peripherals into first and second groups of peripherals and controls the second microprocessor and the first peripherals via the latter first bus line system with the first microprocessor, while controlling the second peripherals with the second microprocessor via the latter bus line system.

The subject invention also extends to a combination which divides peripherals into first and second groups of peripherals, shown in FIG. 1 by way of example, but not by way of limitation, at 22 etc., and 19 etc., providing distinct first and second microprocessors, such as at 12 and 13, constituting such second microprocessor as a peripheral of the first microprocessor, controls the second microprocessor and the first group of peripherals with the first microprocessor, and controls the second group of peripherals with the second microprocessor.

The subject invented disclosure suggests further combinations, subcombinations, modifications and variations within the spirit and scope of the subject invention to those skilled in the art.

We claim:

1. In a method of providing on a substrate a bus line system for first and second circuit boards designed to extend across said substrate, the improvement comprising in combination the steps of:
   providing at a first region of one major plane of said substrate individually dedicated first, second and third bus lines arranged in a first bus line array for coupling to the first circuit boards;
   extending a portion of said first bus line array including said first, second and third bus lines over a first part of said substrate;
   providing at a distinct second region of the substrate individually dedicated fourth, fifth and sixth bus lines corresponding, respectively, to said first, second and third bus lines, and being arranged in a second bus line array for coupling to the second circuit boards;
   extending a portion of said second bus line array including said fourth, fifth and sixth bus lines over a second part of said substrate adjacent said first part;
   said portion of the second bus line array including said fourth, fifth and sixth bus lines in said second part of the substrate representing a mirror image of said portion of the first bus line array including said first, second and third bus lines in said first part of the substrate, as seen with respect to a plane between said first and second parts perpendicular to said one major plane;
   providing a first microprocessor on one of said first circuit boards;
   providing a second microprocessor on one of said second circuit boards;
   providing first peripherals for reading data from or recording data on a document;
   providing second peripherals for transporting said document among said first peripherals for reading data from or recording data on said document by said first peripherals;
   connecting said first peripherals to further ones of said first circuit boards;
   connecting said second peripherals to further ones of said second circuit boards;
   controlling said second microprocessor and said first peripherals with said first microprocessor via said first bus line array; and
   controlling said second peripherals with said second microprocessors via said second bus line array.

2. In a bus system for first and second circuit boards designed to extend across the bus system, the improvement comprising in combination:
   a substrate;
   individually dedicated first, second and third bus lines in a first bus line array at a first region of one major plane of said substrate for coupling to said first circuit boards, a portion of said first bus line array extending over a first part of said substrate; and
   individually dedicated fourth, fifth and sixth bus lines located in a distinct second region of the substrate, corresponding, respectively, to said first, second and third lines, and being arranged in a second bus line array for coupling to said second circuit boards, a portion of said second bus line array extending over a second part of said substrate adjacent said first part;
   said portion of the second bus line array in said second part of the substrate representing a mirror image of said portion of the first bus line array in said first part of the substrate as seen with respect to a plane between said first and second parts perpendicular to said one major plane;
   a first microprocessor on one of said first circuit boards;
   a second microprocessor on one of said second circuit boards;
   first peripherals connected via further ones of said first circuit boards to said first bus line array for reading data from or recording data on a document;
   second peripherals connected via further ones of said second circuit boards to said second bus line array for transporting said document among said first peripherals for reading data from or recording data on said document by said first peripherals;
   means for connecting said first microprocessor to said first peripherals via said first bus line array for control of said second microprocessor and said first peripherals by said first microprocessor via said first bus line array; and
   means for connecting said second microprocessor to said second peripherals via said second bus line array for control of said second peripherals by said second microprocessor via said second bus line array.

3. In apparatus for controlling first peripherals in a microprocessor system including a first microprocessor and a second microprocessor, the improvement comprising in combination:
   means within said first microprocessor controlling said second microprocessor;
   a substrate having first bus lines in a first array and distinct second bus lines in a second array on a major plane of said substrate, with said second array representing a mirror image of said first array with respect to a plane perpendicular to said major plane;
   means for connecting said first peripherals and said second microprocessor to the same first bus lines for control of said second microprocessor and said first peripherals via said first bus lines by said first microprocessor;
   means for connecting said second peripherals to said second bus lines;
   means for connecting said first microprocessor to said first bus lines for control of said second microprocessor and said first peripherals via said first bus lines by said microprocessor; and
   means for connecting said second microprocessor to said second bus lines for control of said second peripherals by said second microprossor via said second bus lines;

said first peripherals including means for reading data from or recording data on a document and said second peripherals include means for transporting said document among said first peripherals for said reading of data from or recording data on said document by said first peripherals.

4. In a method of providing on a substrate a bus line system for a first circuit board designed to extend across said substrate and a second circuit board designed to extend also across said substrate, the improvement comprising in combination the steps of:

provisioning at a first region of one major plane of said substrate individually dedicated first, second and third bus lines in a first bus line array for coupling to the first circuit board, one of said first, second and third bus lines being made different in shape from another of said first, second and third bus lines;

providing at a distinct second region of said one major plane of the substrate individually dedicated fourth, fifth and sixth bus lines corresponding, respectively, to said first, second and third bus lines, and being arranged in a second bus line array for coupling to the second circuit board, said second bus line array representing a mirror image of said first bus line array as seen with respect to a plane perpendicular to said one major plane;

providing a first microprocessor on said one first circuit board;

providing a second microprocessor on said second circuit board;

providing first peripherals for reading data from or recording data on a document;

providing second peripherals for transporting said document among said first peripherals for said reading of data from or recording data on said document by said first peripherals;

connecting said first peripherals to one of said first and second bus line arrays;

connecting said second peripherals to the other of said first and second bus line arrays;

controlling said second microprocessor and said first peripherals with said first microprocessor via said one bus line array; and controlling said second peripherals with said second microprocessor via said other bus line array.

5. A bus system for a first circuit board designed to extend across the bus system and a second circuit board designed to extend also across the bus system, comprising in combination:

a substrate;

individually dedicated first, second and third bus lines in a first bus line array at a first region of one major plane of said substrate for coupling to said first circuit board, one of said first, second and third bus lines being different in shape from another of said first, second and third bus lines;

individually dedicated fourth, fifth and sixth bus lines located in a distinct second region of said one major plane of the substrate, corresponding, respectively, to said first, second and third bus lines, and being arranged in a second bus line array for coupling to the second circuit board, said second bus line array representing a mirror image of said first bus line array as seen with respect to a plane perpendicular to said one major plane;

a first microprocessor on said first circuit board;

a second microprocessor on said second circuit board;

first peripherals connected to one of said first and second bus line arrays for reading data from or recording data on a document;

second peripherals connected to the other of said first and second bus line arrays for transporting said document among said first peripherals for said reading of data from or recording data on said document by said first peripherals;

means for connecting said first microprocessor to said second microprocessor and to said first peripherals via said one bus line array and for controlling said second microprocessor and said first peripherals by said first microprocessor via said one bus line array; and means for connecting said second microprocessor to said second peripherals via said other bus line array for control of said second peripherals by said second microprocessor via said other of said bus line arrays.

* * * * *